United States Patent [19]

Atherton

[11] Patent Number: 4,734,589

[45] Date of Patent: Mar. 29, 1988

[54] A/D PHOTODIODE SIGNAL CONVERSION APPARATUS

[75] Inventor: James H. Atherton, Ringoes, N.J.

[73] Assignee: Honeywell Inc., Minneapolis, Minn.

[21] Appl. No.: 940,692

[22] Filed: Dec. 11, 1986

[51] Int. Cl.[4] .............................................. H01J 40/14
[52] U.S. Cl. ............................... 250/578; 358/213.27; 358/213.13; 358/213.11
[58] Field of Search ........................... 250/578, 211 J; 358/213.27, 213.31, 213.11

[56] References Cited

U.S. PATENT DOCUMENTS

| 4,584,608 | 4/1986 | Soneda et al. | 358/213.31 |
| 4,589,026 | 5/1986 | Ozawa et al. | 358/213.27 |
| 4,617,471 | 10/1986 | Suzuki et al. | 250/578 |
| 4,673,821 | 1/1987 | Morita | 250/578 |

Primary Examiner—David C. Nelms
Assistant Examiner—Chung Seo
Attorney, Agent, or Firm—Charles L. Rubow

[57] ABSTRACT

A method and apparatus for directly converting an analog photodiode signal to digital form using a switched capacitor successive approximation A/D converter. The charge extracted from a video line during a predetermined time interval by a photodiode is compared with charges successively injected onto the video line by a plurality of capacitors of decreasing capacitance value having a reference voltage sequentially impressed thereon. The voltage on the video line is compared with a threshold voltage for each of the capacitors, and the capacitor is returned to its previous state if it is found to have injected sufficient charge to increase the voltage on the video line to above the threshold voltage. The states of the capacitors at the conclusion of the process is a digital representation of the light intensity at the photodiode.

10 Claims, 2 Drawing Figures

A/D PHOTODIODE SIGNAL CONVERSION APPARATUS

BACKGROUND OF THE INVENTION

The invention disclosed herein relates generally to a method and apparatus for producing a digital representation of a photodiode signal, and more particularly to a switched capacitor successive approximation analog to digital conversion method and circuitry for directly producing a digital signal representative of the charge on a photodiode.

It is well known to use a reverse biased semiconductor p-n junction to convert light intensity into an electrical signal. This characteristic of a photodiode has long been used in a variety of light sensing applications. It has also become well known to employ arrays of photodiodes in optical recognition applications. The more elementary applications require only that the output signal of a photodiode element indicate whether light intensity is above or below a predetermined level. As an example, many optical character recognition systems only require information as to the presence or absence of a marking at a spot being read.

More recently, increasing numbers of image sensing applications have emerged requiring gray scale representations of a detected image. Notable examples may be found in the fields of robotics and factory automation, as well as in a rapidly expanding variety of other applications.

Since the majority of such applications utilize digital signal processing, it is necessary to obtain digital representations of the photodiode signals. The signal produced by a photodiode is an electric charge, or more specifically, a change in electric charge. The most common conventional approach to digitization is to convert the charge signal to an analog voltage level, and then perform an analog to digital conversion of the voltage level to produce a digital signal. Although the technology for accomplishing these operations is well developed and capable of producing highly satisfactory results, elimination of any of the signal processing steps offers the potential for greater simplicity, lower manufacturing cost, smaller size and greater accuracy. Alternatively, semiconductor area and other resources released by elimination of unnecessary operations may be used for more sophisticated signal processing and peripheral functions.

The present invention achieves significant advances in minimizing the size and expense of a photodetector device with digital gray scale readout capability by directly converting the changes in charge on reverse biased photodiodes in a diode array to digital representations, while retaining good performance capabilities. A circuit in accordance with the applicant's invention is well suited for fabrication with standard CMOS integrated circuit designs which provide for low power consumption and low cost.

SUMMARY OF THE INVENTION

The present invention is a method and apparatus for directly converting the change in charge on a reverse biased semiconductor p-n junction to a digital representation compatible with common digital signal processing circuits and techniques. The method basically comprises periodically charging a photodiode to a threshold while initializing the charge on a set of capacitors whose capacitance values are of a predetermined relationship, e.g., binary weighting. The photodiode and capacitors, which are electrically connected at a sense node, are then isolated from the source of threshold voltage for a predetermined time interval during which the charge on the sense node is depleted at a rate depending on light intensity at the photodiode. The voltage on the second plates of the capacitors is then sequentially raised to a reference voltage, and the effect on a sense node is noted. If the voltage at sense node rises above a threshold voltage, indicating that the capacitor had supplied more charge than was extracted by the diode, the second plate of the capacitor is returned to its previous voltage. After each of the capacitors has been subjected to the same operation, the states of switches through which voltage is supplied to the second capacitor plates is read as a digital representation of illumination intensity at the diode.

Apparatus according to the invention basically comprises a sense node to which the first plates of a plurality of capacitors are electrically connected. A photodiode having one terminal connected to circuit ground is also electrically connected to the sense node. The second plates of the capacitors are each connected through a switching network to circuit ground and to a reference voltage source. Charging means alternately charges the sense node to a threshold voltage, and then allows the sense node to electrically float for an interval of time. The switching network is controlled by control means so as to connect the second plates of the capacitors to circuit ground during the time the sense node is charged to the threshold voltage, and so as to sequentially connect the second plates to the reference voltage source a predetermined time after the sense node is allowed to float. A comparator connected to the sense node supplies a characteristic output signal to the control means if the voltage at the sense node becomes larger than the threshold voltage. The control circuit responds to a characteristic comparator output signal, which indicates that the capacitor supplied more charge to the sense node than was extracted by the photodiode, by switching the second plate of the capacitor back to circuit ground. An output circuit responsive to the switch states of the switching network produces a digital signal representation of the switch states and hence the illumination intensity at the photodiode.

The threshold voltage may be generated by an inverter which serves as the comparator, in combination with a switch connecting the inverter output and input terminals. The photodiode may be one of an array of photodiodes whose signals are multiplexed to the sense node.

DESCRIPTION OF THE PREFERRED EMBODIMENT

Figure 1:
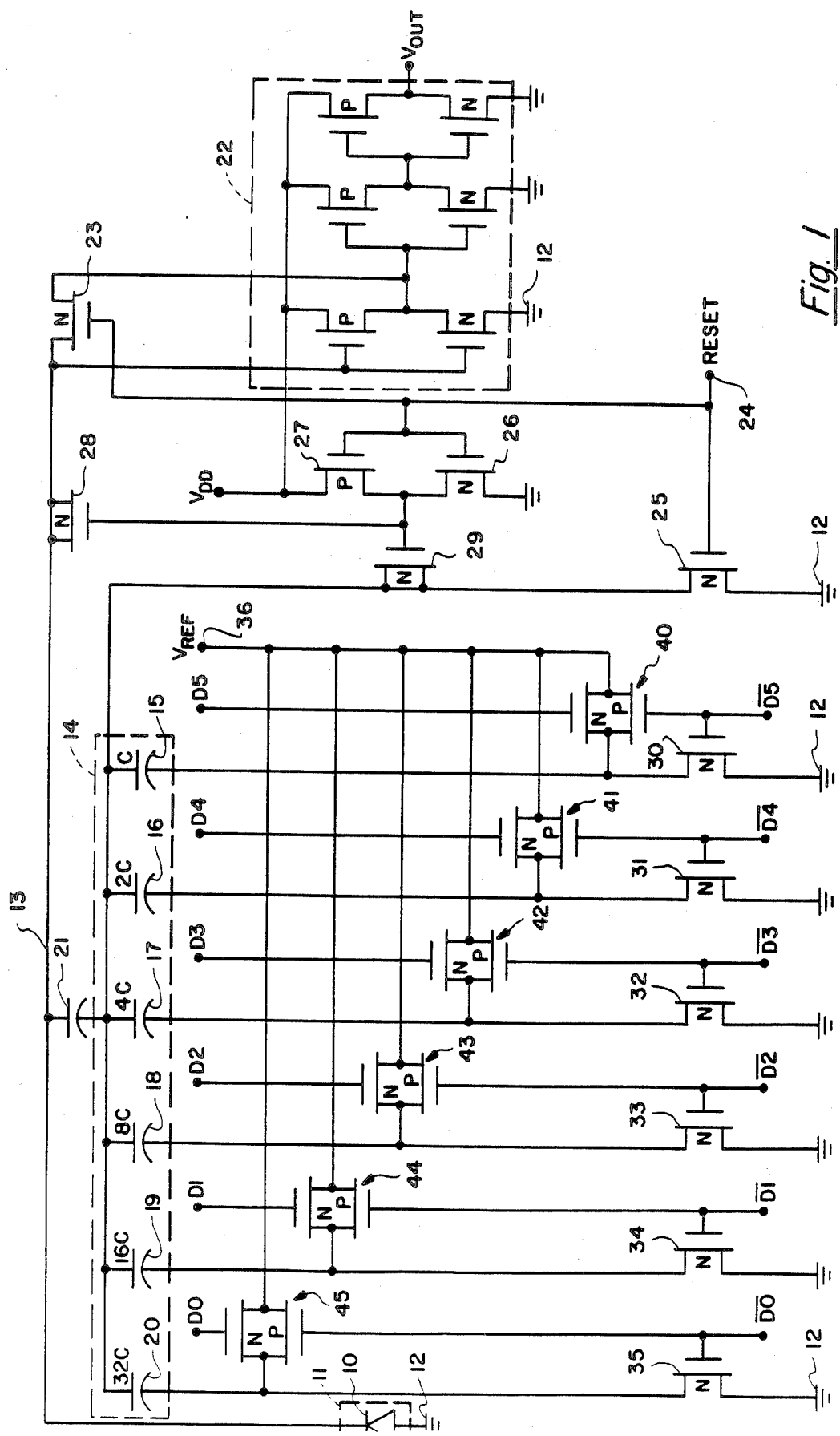
FIG. 1 is a schematic circuit diagram of a capacitor network and comparator employed in the applicant's photodiode signal conversion apparatus.
Figure 2:
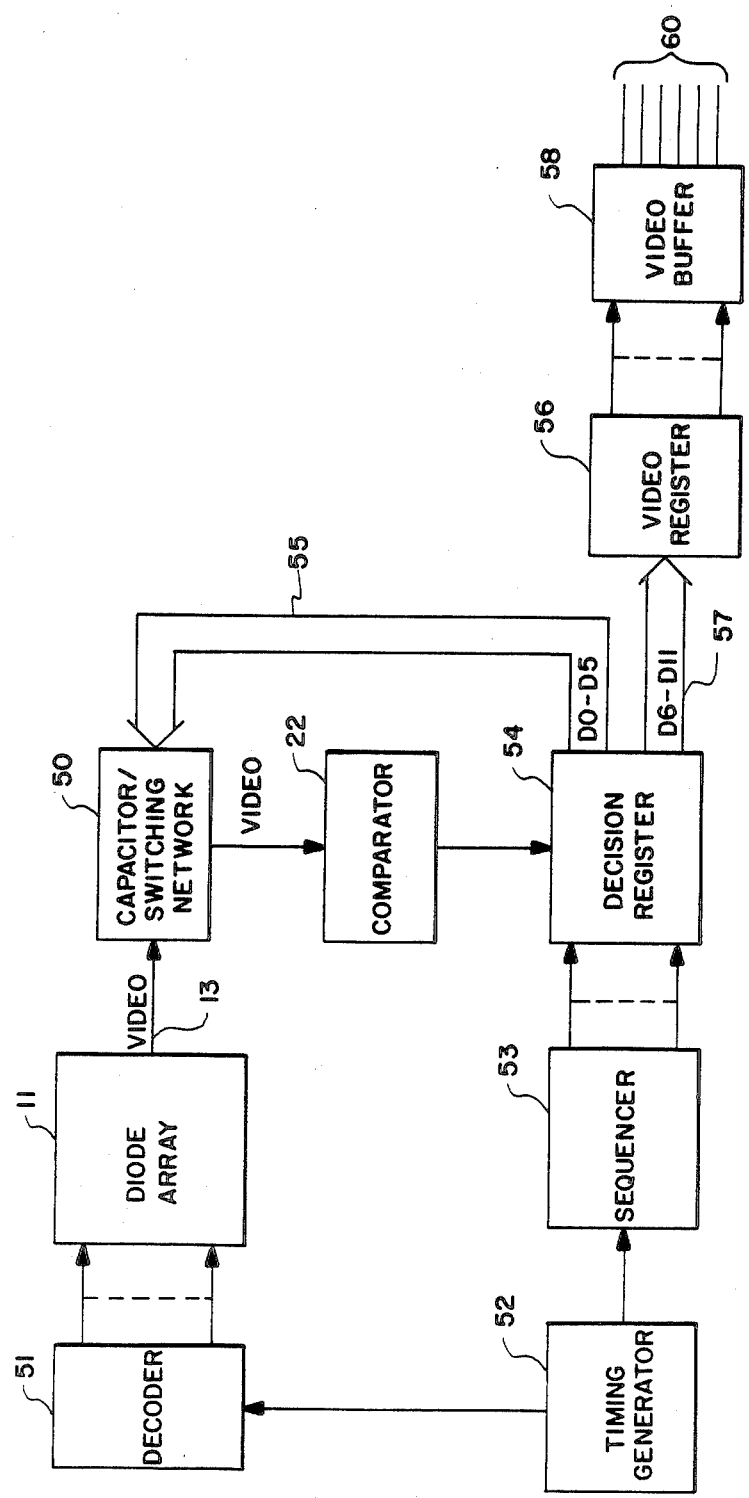
FIG. 2 is a general schematic block diagram of photodiode image sensor employing signal conversion apparatus in accordance with the present invention.

In FIG. 1, reference numeral 10 identifies a photodiode which may be one of an array of photodiodes 11 to be further discussed in connection with FIG. 2. The anode of diode 10 is connected to a source 12 of circuit ground or suitable reference potential. The cathode of diode 10 is connected to a video line 13, hereinafter referred to as a sense node.

Reference numeral 14 identifies a set of capacitors shown as including six capacitors 15–20 having binary weighted capacitance values. Specifically, capacitor 15 is shown as having a unit capacitance value C. Capacitor 16–20 have capacitance values 2C, 4C, 8C, 16C and 32C respectively. The number of capacitors can be varied depending on the desired resolution of A/D conversion. With the six capacitors shown, 64 levels of conversion ($2^6$) can be achieved. In practice in an integrated circuit implementation, good capacitor matching and capacitance value ratioing may be achieved by using unit capacitors connected in parallel to form the larger capacitors. For example, capacitor 20 may be formed of 32 unit capacitors of capacitance value C.

First plates of each of capacitors 15–20 are electrically connected to sense node 13 through a small coupling capacitor 21. The function of coupling capacitor 21 is to attenuate charge supplied to sense node 13 by capacitors 15–20 so that it is comparable with charge extracted from the sense node by photodiode 10.

Reference numeral 22 identifies a three stage inverter which functions as a comparator. The comparator and the switching devices shown in the schematic are implemented with CMOS field effect transistors (FETs) which exhibit low power consumption and are readily fabricated at low cost using well developed processes.

A FET switch 23 is connected between the output and input terminals of the first stage of comparator 22. The input terminal of comparator 22 is connected to sense node 13. The gate electrode of FET 23 is connected to a reset terminal 24 which is also connected to the gate electrode of a FET 25 which forms a switch between the first plates of capacitors 15–20 and circuit ground 12.

Reset terminal 24 is also connected to the gate electrodes of FETs 26 and 27 which form an inverter, the output signal of which is supplied to the gate electrode of a FET 28 having both its source and drain electrodes connected to sense node 13 and to a FET 29 having both its source and drain electrodes connected to the first plates of capacitors 15–20. FETs 28 and 29 are used to cancel the capacitive feedthrough of FET switches 23 and 25.

The second plates of capacitors 15–20 are connected to circuit ground 12 through FET switches 30–35 respectively. The second plates of capacitors 15–20 are also connected to a reference voltage source 36 through FET switches 40–45 respectively. Switches 30–35 and 40–45 selectively connect the second plates of capacitors 15–20 to either circuit ground 12 or reference voltage source 36 depending on control signals D0–D5 and $\overline{D0}$–$\overline{D5}$ as will hereinafter be described.

System operation is initiated by supplying a high signal to reset terminal 24 which causes FET switches 23 and 25 to conduct, thereby applying the threshold voltage of comparator 22 to sense node 13 and charging photodiode 10 and coupling capacitor 21 to the threshold voltage. Charging of capacitor 21 results in charging of the top plates of capacitors 15–20 to a corresponding voltage. At the same time, a low signal is supplied to control terminals D0–D5 (and a corresponding high signal is supplied to control terminals $\overline{D0}$–$\overline{D5}$), thereby causing the capacitor set 14 to be discharged. The signal at reset terminal 24 is then changed to a low state, thus electrically floating sense node 13.

Light incident on photodiode 10 causes sense node 13 to discharge. The charge extracted from sense node 13 is the time integral of the photocurrent flowing through photodiode 10. This extracted charge is an analog representation of the illumination intensity present at photodiode 10.

After a predetermined integration time, signals are supplied to control terminals D0, $\overline{D0}$ to switch the bottom plate of capacitor 20 from ground potential to the reference voltage at source 36. This action causes charge to be injected onto the video line (sense node 13). If the injected charge is less than the amount of charge removed from the video line by photocurrent then the output of comparator 22 will remain high. As will be further described in connection with FIG. 2, a high output from comparator 22 will result in signals which cause FET switches 35 and 45 to remain in their present states and the present charge to remain on capacitor 20.

However, if the charge injected onto the video line from capacitor 20 is greater than the charge removed from the video line by photocurrent then comparator 22 will switch to a low output state. A low output from the comparator causes the states of FET switches 35 and 45 to change, thus removing the previously injected charge from the video line.

The process described in connection with capacitor 20 and switches 35 and 45 is thereafter sequentially performed with the remaining capacitors and their associated switches. In each case, a high output from the comparator results in the bottom plate of the capacitor being maintained at the reference voltage. A low output results in the second plate of the capacitor being returned to ground potential. After the same operation has been completed with all of the capacitors, the state of control signals D0–D5 is a digital representation of the light intensity present at photodiode 10.

The process described in connection with FIG. 1 is also applicable to an array of photodiodes as illustrated in the block diagram of FIG. 2. In FIG. 2, the diode array, video line (sense node) and comparator are identified by reference numerals 11, 13 and 22 respectively, as in FIG. 1. Capacitor array 14 is contained in a block 50 labelled CAPACITOR/SWITCHING NETWORK.

The photodiodes in diode array 11 are sequentially addressed by a decoder 51 under the control of a timing generator 52. Thus, the process described in connection with photodiode 10 in FIG. 1 is sequentially performed on each diode in diode array 11.

Timing generator 52 also controls a sequencer 53 which, among other things, keeps track of the diode being addressed, and supplies corresponding signals to a decision register 54. Decision register 54 also receives the output signal of comparator 22, in response to which it produces switch control signals D0–D5 which are supplied to capacitor/switching network 50 as indicated at 55.

Signals indicative of the states of switch control signals D0–D5 are supplied to a video register 56 as indicated at 57. Video register 56 produces a digital representation in desired form of the light intensity at a photodiode in diode array 11. This digital representation is supplied to a video buffer 58 from which it is furnished at a suitable time over output lines 60.

As described in connection with FIGS. 1 and 2, the applicant has devised a unique method and apparatus for achieving very direct conversion of an analog photodiode signal to digital form. Although a specific embodiment has been shown and described for illustrative purposes, a variety of other embodiments and modifications will be apparent to those skilled in the relevant arts. It is not intended that coverage be limited to the embodiments disclosed herein, but only by the terms of the following claims.

The embodiments of the invention in which an exclusive property or right is claimed are defined as follows:

1. A photodiode signal conversion circuit comprising:
    a source of circuit ground;
    a photodiode having an anode and a cathode, the anode being connected to said source of circuit ground;
    a plurality of capacitors, each having first and second plates, and having capacitance values of a predetermined relationship;
    a sense node;
    means connecting the first plates of said plurality of capacitors to said sense node;
    a reference voltage source;
    switching means for selectively connecting the second plates of said plurality of capacitors to either said source of circuit ground or said reference voltage source;
    charging means operable to alternately charge said sense node to a threshold voltage and then allow said sense node to electrically float for a first time interval;
    comparator means connected to said sense node, said comparator means having an output terminal at which is produced a characteristic signal if the voltage on said sense node is larger than the threshold voltage;
    control means responsive to the output signal of said comparator means to supply control signals to said switching means, said control means being operable during the time said sense node is being charged to the threshold voltage to connect the second plates of said plurality of capacitors to said source of circuit ground, said control means further being operable after a predetermined delay during the first time interval to sequentially connect the second plates of said plurality of capacitors to said reference voltage source, and, if connection of the second plate of any one of said plurality of capacitors in production of a characteristic signal by said comparator, to reconnect the second plate of that capacitor to the source of circuit ground; and
    digital output means responsive to the state of said switching means to produce a digital representation thereof, the digital representation being indicative of the light intensity at said photodiode.

2. The conversion circuit of claim 1 wherein:
    the capacitance values of the capacitors in said plurality of capacitors are weighted in a binary relationship; and
    said control means is operable to sequentially connect the second plates of the capacitors to said reference voltage source in descending order of capacitance values.

3. The conversion circuit of claim 2 wherein:
    said comparator means comprises an inverter; and
    said charging means comprises a switch operable to periodically electrically connect the output terminal of said comparator means to an input terminal thereof.

4. The conversion circuit of claim 3 wherein said means connecting the first plates of said plurality of capacitors to said sense node comprises a coupling capacitor.

5. An optical image sensing system providing direct conversion of photodiode sensing element output signals to digital form, comprising:
    a sense node;
    a source of circuit ground;
    an array of photodiodes, each having an anode and a cathode, the anodes being connected to said source of circuit ground;
    a plurality of capacitors, each having first and second plates, and having capacitance values of a predetermined relationship;
    means connecting the first plates of said plurality of capacitors to said sense node;
    a reference voltage source;
    a multiplexer operable to sequentially connect the cathodes of the photodiodes in said array to said sense node;
    switching means for selectively connecting the second plates of said array of capacitors to either said source of circuit ground or said reference voltage source;
    charging means operable to alternately charge said sense node to a threshold voltage and then allow said sense node to electrically float for a first time interval;
    comparator means connected to said sense node, said comparator means having an output terminal at which is produced a characteristic signal if the voltage on said sense node is larger than the threshold voltage;
    control means responsive to the signal produced at the output terminal of said comparator means to supply control signals to said switching means, said control means being operable during the time said sense node is being charged to the threshold voltage to connect the second plates of said plurality of capacitors to said source of circuit ground, said control means further being operable after a predetermined delay during the first time interval to sequentially connect the second plates of said plurality of capacitors to said reference voltage source, said control means being responsive to production of a characteristic signal by said comparator means to switch the second plate of said capacitor from said reference voltage source to said source of circuit ground; and
    digital output means responsive to the state of said switching means to produce a digital representation thereof, the state of said switching means being indicative of the light intensity at the photodiode connected to said sense node.

6. The optical image sensing system of claim 5 wherein:
    said comparator means comprises an inverter; and
    said charging means comprises a switch operable to periodically electrically connect the output terminal of said comparator means to an input terminal thereof.

7. The optical image sensing system of claim 6 wherein:
    the capacitance values of the capacitors in said plurality of capacitors are weighted in a binary relationship; and said control means is operable to sequentially connect the second plates of the capacitors to said reference voltage source in descending order of capacitance values.

8. The optical image sensing system of claim 7 wherein said means connecting the first plates of said plurality of capacitors to said sense node comprises a coupling capacitor.

9. A method of directly obtaining a digital representation of a photodiode signal, comprising the steps of:

charging a sense node to which the first electrode of a photodiode and the first plates of a plurality of capacitors having a predetermined relationship of capacitance values are electrically connected to a threshold voltage;

electrically isolating the sense node from the source of threshold voltage for a predetermined time interval during which the rate at which the charge on the photodiode and capacitors changes is dependent on the light intensity at the photodiode;

sequentially increasing the voltage on the second plates of the capacitors in the plurality of capacitors from a first voltage to a reference voltage;

returning the second plate of each capacitor to the first voltage if the step of increasing the voltage on the second plate thereof resulted in the voltage on the sense node exceeding a threshold voltage; and producing a signal indicative of the voltage states of the capacitors as a digital representation of the light intensity to which the photodiode is exposed.

10. The method of claim 9 wherein:

the capacitance values of the plurality of capacitors are weighted in a binary relationship; and the step of sequentially increasing the voltage on the second plates of the capacitors is done in descending order of capacitance values.

* * * * *

UNITED STATES PATENT AND TRADEMARK OFFICE
CERTIFICATE OF CORRECTION

PATENT NO.  : 4,734,589

DATED       : MARCH 29, 1988

INVENTOR(S) : JAMES H. ATHERTON

It is certified that error appears in the above-identified patent and that said Letters Patent is hereby corrected as shown below:

Claim 1, column 5, line 48, after "tors" insert

--results--.

Signed and Sealed this

Ninth Day of August, 1988

Attest:

DONALD J. QUIGG

Attesting Officer

Commissioner of Patents and Trademarks